(12) United States Patent
Lee

(10) Patent No.: US 11,955,435 B2
(45) Date of Patent: Apr. 9, 2024

(54) SEMICONDUCTOR PACKAGES

(71) Applicant: SK hynix Inc., Icheon-si (KR)

(72) Inventor: Ki Yong Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 171 days.

(21) Appl. No.: 17/564,724

(22) Filed: Dec. 29, 2021

(65) Prior Publication Data

US 2023/0048228 A1 Feb. 16, 2023

(30) Foreign Application Priority Data

Aug. 11, 2021 (KR) .................. 10-2021-0106356

(51) Int. Cl.
*H01L 23/544* (2006.01)
*H01L 23/31* (2006.01)
*H01L 25/065* (2023.01)

(52) U.S. Cl.
CPC ........ *H01L 23/544* (2013.01); *H01L 23/3128* (2013.01); *H01L 25/0657* (2013.01); *H01L 2223/54406* (2013.01); *H01L 2223/54433* (2013.01); *H01L 2223/54493* (2013.01); *H01L 2225/06506* (2013.01); *H01L 2225/0651* (2013.01); *H01L 2225/06524* (2013.01); *H01L 2225/06562* (2013.01)

(58) Field of Classification Search
CPC ..................................................... H01L 23/544
See application file for complete search history.

(56) References Cited

U.S. PATENT DOCUMENTS

| 9,922,935 | B2 | 3/2018 | Kim | |
|---|---|---|---|---|
| 2016/0079178 | A1* | 3/2016 | Kim | .................. H01L 21/4853 257/773 |
| 2022/0165678 | A1* | 5/2022 | Kim | ...................... H01L 23/295 |

FOREIGN PATENT DOCUMENTS

KR 101831036 B1 2/2018

* cited by examiner

*Primary Examiner* — Yu-Hsi D Sun
(74) *Attorney, Agent, or Firm* — William Park & Associates Ltd.

(57) ABSTRACT

A semiconductor package includes a semiconductor die and an encapsulant layer. A mark is formed on a surface of the encapsulant layer. A damage barrier layer is disposed between the mark and the semiconductor die. The damage barrier layer blocks the propagation of laser light used to form the mark from reaching the semiconductor die.

18 Claims, 10 Drawing Sheets

SEMICONDUCTOR PACKAGES

CROSS-REFERENCE TO RELATED APPLICATION

The present application claims priority under 35 U.S.C 119(a) to Korean Application No. 10-2021-0106356, filed on Aug. 11, 2021, which is incorporated herein by reference in its entirety.

BACKGROUND

1. Technical Field

The present disclosure relates to a semiconductor package technology, and more particularly, to a semiconductor package including a mark.

2. Related Art

A semiconductor package may include a semiconductor die, a packaging substrate, and an encapsulant layer. Integrated circuits (ICs) may be integrated into the semiconductor die. The semiconductor die may be mounted on the packaging substrate. The encapsulant layer may be formed over the packaging substrate to protect the semiconductor die.

Semiconductor packages capable of implementing high density and high performance may be required. Attempts have been made to embed a plurality of semiconductor dies in a semiconductor package structure. Stack packages or multi-chip packages has been proposed. Semiconductor packages suitable for mobile devices may be required. Semiconductor packages may be required to have a smaller form factor. Semiconductor packages may be required to have a thinner thickness.

The semiconductor packages may include marks formed on a surface of the encapsulant layer. The mark may indicate information about the semiconductor package, such as identity information or manufacturing information of the semiconductor package.

SUMMARY

In accordance with an embodiment of the present disclosure is a semiconductor package including a semiconductor die, an encapsulant layer covering the semiconductor die, a mark formed on a surface of the encapsulant layer, and a damage barrier layer disposed between the mark and the semiconductor die.

In accordance with another embodiment of the present disclosure is a semiconductor package including a packaging substrate, a plurality of semiconductor dies stacked on the packaging substrate, a damage barrier layer attached to an upper surface of an uppermost semiconductor die of the plurality of semiconductor dies, an encapsulant layer covering the plurality of semiconductor dies and the damage barrier layer, and a mark formed on a portion of the encapsulant layer overlapping the damage barrier layer.

DETAILED DESCRIPTION

Figure 1:
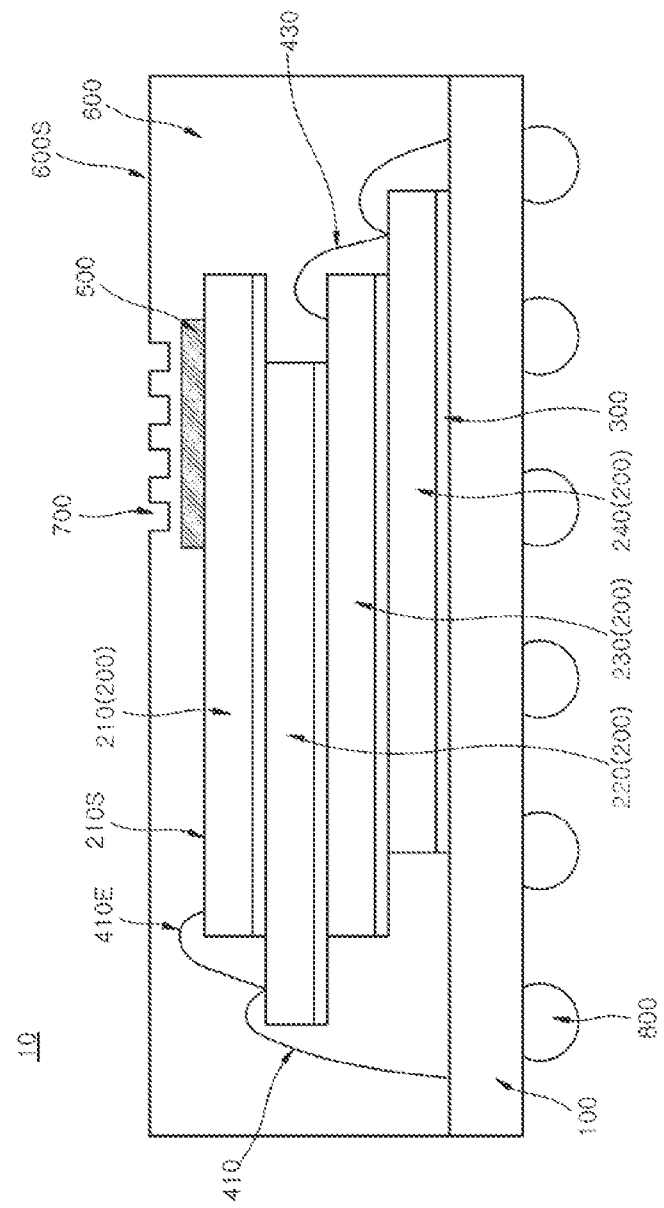
FIG. 1 is a schematic cross-sectional view illustrating a semiconductor package according to an embodiment of the present disclosure.

The terms used in the description of example embodiments of the present disclosure are terms selected in consideration of their functions, and the meaning of the terms may vary according to the intention or custom of users or operators in the technical field. The meanings of the terms used are in accordance with the defined definitions when specifically defined in the present disclosure. If no specific definition is provided for a term, the term may be interpreted as having the meaning generally recognized by those skilled in the art.

In the description of the embodiments of the present disclosure, descriptions such as "first," "second," "side," "top," and "bottom or lower" are to distinguish subsidiary materials, not used to limit the subsidiary materials themselves or to imply any particular order.

A semiconductor device may include a semiconductor substrate or a structure in which plurality of semiconductor substrates are stacked. The semiconductor device may indicate a semiconductor package structure in which a structure in which semiconductor substrates are stacked is packaged. Semiconductor substrates may refer to semiconductor wafers, semiconductor dies, or semiconductor chips on which electronic components and elements are integrated. A semiconductor chip may refer to a memory chip in which a memory integrated circuit including DRAM, SRAM, NAND FLASH, NOR FLASH, MRAM, ReRAM, FeRAM, or PcRAM is integrated, or a logic die in which a logic circuit is integrated on a semiconductor substrate or a processor such as an ASIC chip, an application processor (AP), a graphic processing unit (GPU), a central processing unit (CPU), or a system on a chip (SoC). The semiconductor device may be applied to information communication devices such as portable terminals, bio or health care related electronic devices, and wearable electronic devices. The semiconductor device may be applied to the Internet of Things.

The same reference numerals may refer to the same elements throughout the present disclosure. The same reference numerals or similar reference numerals may be described with reference to other drawings, even if they are not mentioned or described in the corresponding drawings. Further, even if a reference numeral is not indicated, it may be described with reference to other drawings.

FIG. 1 is a schematic cross-sectional view illustrating a semiconductor package 10 according to an embodiment of the present disclosure.

Referring to FIG. 1, a semiconductor package 10 may include semiconductor dies 200, an encapsulant layer 600, a mark 700, and a damage barrier layer 500. The semiconductor package 10 may include a packaging substrate 100, a first semiconductor die 220, a second semiconductor die 210, the encapsulant layer 600, the mark 700, and the damage barrier layer 500. The semiconductor package 10 may further include a third semiconductor die 230 and a fourth semiconductor die 240. The semiconductor package 10 may further include a first bonding wire 410 and a second bonding wire 430. The packaging substrate 100 may further include outer connectors 800.

The semiconductor die 200 may include a device in which integrated circuits (ICs) are integrated. The semiconductor die 200 may include a semiconductor device in which memory devices such as DRAM devices or NAND devices are integrated. The semiconductor package 10 may include a stack package structure in which a plurality of semiconductor dies 200 are stacked substantially vertically. Another semiconductor die or a plurality of semiconductor dies may be further disposed between the packaging substrate 100 and the stack of the semiconductor dies 200.

The fourth semiconductor die 240 may be disposed on the packaging substrate 100, and the third semiconductor die 230 may be stacked on the fourth semiconductor die 240. The third semiconductor die 230 may be stacked on the fourth semiconductor die 240 while exposing a portion of the fourth semiconductor die 240. The third semiconductor die 230 may be disposed while being offset by a distance from a location where the fourth semiconductor die 240 is disposed. The third semiconductor die 230 may be offset stacked on the fourth semiconductor die 240 while partially overlapping with the fourth semiconductor die 240.

The first semiconductor die 220 may be offset stacked on the third semiconductor die 230. The second semiconductor die 210 may be offset stacked on the first semiconductor die 220. The second semiconductor die 210 may be an uppermost die positioned at the uppermost layer in the stack of the semiconductor dies 200. The second semiconductor die 210 may be offset stacked on the first semiconductor die 220 in a direction opposite to a direction in which the first semiconductor die 220 is offset stacked on the third semiconductor die 230.

The fourth semiconductor die 240 may be attached to the packaging substrate 100 by an adhesive layer 300. Other adhesive layers 300 may be disposed between the semiconductor dies 200 to adhere the semiconductor dies 200 to each other.

The semiconductor dies 200 may be electrically connected to the packaging substrate 100 by inner connectors such as the first and second bonding wires 410 and 430. The first bonding wire 410 may electrically connect the second semiconductor die 210 to the packaging substrate 100. The first bonding wire 410 may be connected to the second semiconductor die 210 and may further extend to be connected to the packaging substrate 100. One end 410E of the first bonding wire 410 may be bonded or connected to a portion of an upper surface 210S of the second semiconductor die 210.

The first bonding wire 410 may extend to interconnect the second semiconductor die 210 and the first semiconductor die 220. The first bonding wire 410 may connect the second semiconductor die 210 and the first semiconductor die 220 to the packaging substrate 100. The second bonding wire 430 may further extend to connect the third semiconductor die 230 to the fourth semiconductor die 240, and to connect the third semiconductor die 230 and the fourth semiconductor die 240 to the packaging substrate 100. The second bonding wire 430 and the first bonding wire 410 may be positioned at opposite positions with the semiconductor dies 200 therebetween.

The semiconductor die 200 or the semiconductor dies 200 may be disposed over the packaging substrate 100. The packaging substrate 100 may be an interconnection component that electrically connects the semiconductor dies 200 to an external device, an external module, or external components. The packaging substrate 100 may be configured in the form of a printed circuit board (PCB). The packaging substrate 100 may be configured in a redistribution layer (RDL) structure. The redistribution layer structure may include a dielectric layer and conductive patterns disposed in the dielectric layer. The outer connectors 800 may include solder balls or conductive bumps.

The encapsulant layer 600 may be formed as a layer that covers and seals the semiconductor dies 200 on the packaging substrate 100. The encapsulant layer 600 may be formed on the packaging substrate 100 to cover the first semiconductor die 220, the second semiconductor die 210, and the damage barrier layer 500. The encapsulant layer 600 may include various encapsulation materials. The encapsulant layer 600 may include an epoxy molding compound (EMC). The encapsulant layer 600 may be formed by a molding process of molding EMC to cover the semiconductor dies 200 on the packaging substrate 100.

Figure 2:
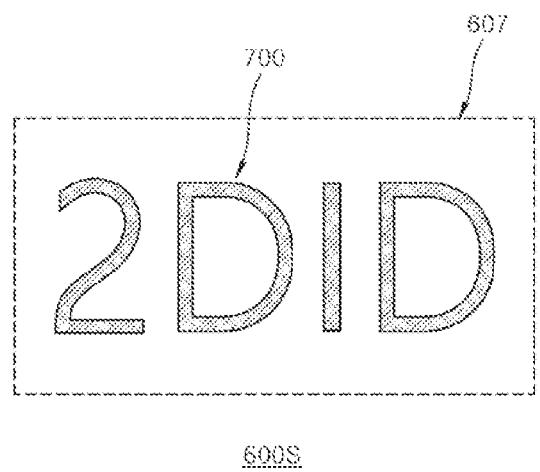
FIG. 2 is a schematic plan view illustrating an example of a mark formed on the semiconductor package of FIG. 1.

FIG. 2 is a schematic plan view illustrating an example of a mark 700 formed in the semiconductor package 10 of FIG. 1.

Referring to FIGS. 2 and 1, the mark 700 may be formed on an upper surface 600S of the encapsulant layer 600. A marking region 607 of the encapsulant layer 600 may be a region including a portion of the upper surface 600S of the encapsulant layer 600. The marking region 607 of the encapsulant layer 600 may overlap with the packaging substrate 100 and the semiconductor dies 200. The mark 700 may be formed in a portion of the marking area 607 of the encapsulant layer 600. The mark 700 may include alphanumeric characters or other symbols that convey information. The mark 700 may be formed as a mark providing recognition information of the semiconductor package (10 of FIG. 1). The mark 700 may indicate information including a run number, a manufacturing identifying number, data of manufacture, or a combination thereof. The mark 700 may be formed on the upper surface 600S of the encapsulant layer 600 by a laser marking process. The mark 700 may be engraved on the upper surface 600S of the encapsulant layer 600 in a groove shape or an opening shape.

Figure 3:
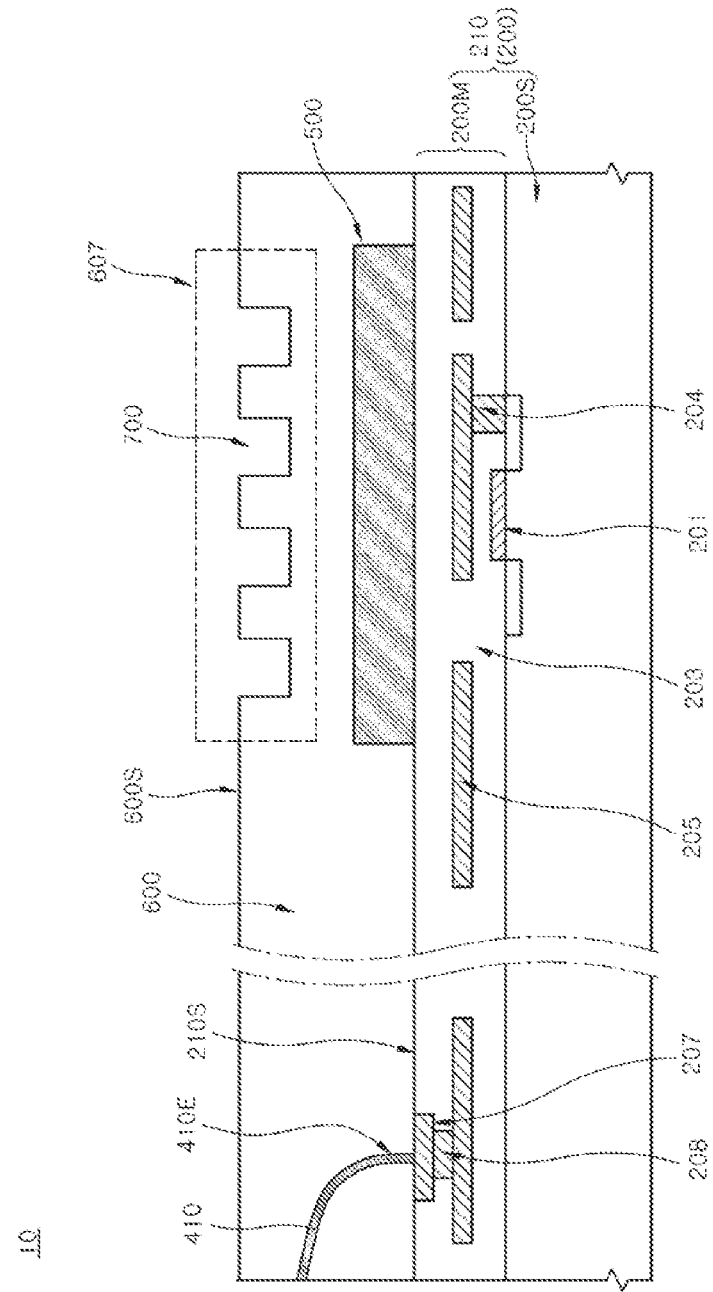
FIG. 3 is an enlarged schematic cross-sectional view of a portion of the semiconductor package of FIG. 1.

FIG. 3 is an enlarged schematic cross-sectional view illustrating a portion of the semiconductor package 10 of FIG. 1 including the damage barrier layer 500 and the second semiconductor die 210.

Referring to FIGS. 3 and 1, the damage barrier layer 500 may be disposed between the mark 700 and the semiconductor die 200 of the semiconductor package 10. The damage barrier layer 500 may be attached to the upper surface 210S of the second semiconductor die 210. The damage barrier layer 500 may be limitedly attached to only a portion of the upper surface 210S of the second semiconductor die 210. The mark 700 may be formed in the marking region 607 of the encapsulant layer 600, as illustrated in FIG. 3, and the marking region 607 may be overlapped with the damage barrier layer 500. The damage barrier layer 500 may be attached to the second semiconductor die 210 to cover a portion of the second semiconductor die 210. The portion of the second semiconductor die 210 to which the damage barrier layer 500 is attached may overlap with the mark 700. The damage barrier layer 500 may be attached to the upper surface 210S of the second semiconductor die 210, but might not overlap with the first bonding wire 410 and may be disposed at a position spaced apart from the first bonding wire 410 while exposing the first bonding wire 410.

In the laser marking process of forming the mark 700, the damage barrier layer 500 may substantially prevent or limit damage to the underlying second semiconductor die 210. The damage barrier layer 500 may protect or shield the second semiconductor die 210 from the laser marking process. The damage barrier layer 500 may substantially block or attenuate the propagation of laser light used in the laser marking process to the second semiconductor die 210. The damage barrier layer 500 may include a layer that reflects laser light. The damage barrier layer 500 may include a layer that absorbs or scatters laser light. It is possible to form the mark 700 on the upper surface 600S of the encapsulant layer 600 by the laser marking process while preventing or mitigating damage to the second semiconductor die 210 by using the damage barrier layer 500.

The second semiconductor die 210 may be disposed in the semiconductor package 10 such that the upper surface 210S of the second semiconductor die 210 faces the upper surface 600S of the encapsulant layer 600 or a portion of the upper surface 210S faces the mark 700. The second semiconductor die 210 may include a semiconductor substrate 200S and a metallization structure layer 200M. The metallization structure layer 200M may be formed on the semiconductor substrate 200S. The semiconductor substrate 200S may include a semiconductor material including silicon (Si). Electronic components 201 may be formed in or on the semiconductor substrate 200S. The electronic components 201 may be elements configuring an integrated circuit. The electronic components 201 may include active elements such as transistor devices.

The metallization structure layer 200M may include a dielectric layer 203, first conductive contacts 204, conductive patterns 205, bonding pads 207, and second conductive contacts 208. The conductive patterns 205 and the first and second conductive contacts 204 and 208 may be conductive layers providing a multilayer interconnection structure. The conductive patterns 205 may be electrically connected to the electronic components 201 through the first conductive contacts 204. The dielectric layer 203 may be an insulating layer that insulates the conductive pattern 205 and the first and second conductive contacts 204 and 208. The dielectric layer 203 may be formed to expose the bonding pads 207.

The bonding pad 207 may be a connection terminal connected to an external device or other connection members. The first bonding wire 410 may be physically and electrically connected to the bonding pad 207. One end 410E of the first bonding wire 410 may be bonded to the bonding pad 207. The second conductive contact 208 may electrically connect the bonding pad 207 to the conductive pattern 205. The dielectric layer 203 may be a layer that provides the upper surface 210S of the second semiconductor die 210. The damage barrier layer 500 may be attached to the upper surface 210S of the dielectric layer 203 while being spaced apart from the first bonding wire 410. The dielectric layer 203 may include various silicon oxide ($SiO_2$), silicon nitride ($Si_3N_4$), a low k material, or a polymer layer.

Figure 4:
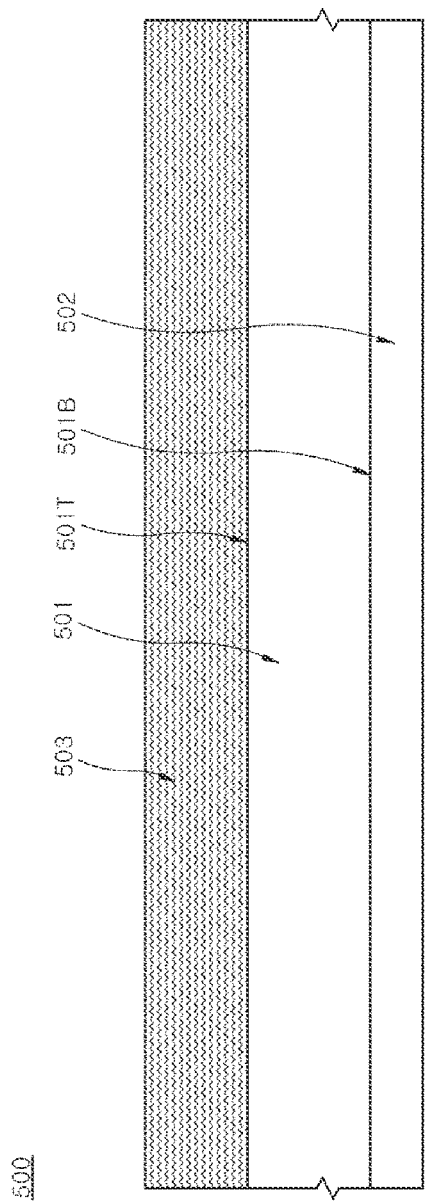
FIG. 4 is a schematic cross-sectional view illustrating an example of a damage barrier layer of the semiconductor package of FIG. 3.

FIG. 4 is a schematic cross-sectional view illustrating an example of the damage barrier layer 500 of the semiconductor package 10 of FIG. 3.

Referring to FIGS. 4 and 3, the damage barrier layer 500 according to an example may include a reflective layer 503 that reflects laser light. The reflective layer 503 may be composed of a layer that reflects laser light of a wavelength band used in a laser marking process. Green laser light or yttrium aluminum garnet (YAG) laser light may be used in the laser marking process. The green laser light may have a wavelength band of approximately 532 nm, and the YAG laser light may have a wavelength band of approximately 1064 nm. The reflective layer 503 may include a metal layer that reflects laser light in these wavelength bands.

The metal layer that may be used as the reflective layer 503 may include copper, brass, bronze, aluminum, gold, or silver. The metal layer that may be used as the reflective layer 503 may include an alloy including copper, brass, bronze, aluminum, gold, or silver. The metal layer used as the reflective layer 503 may include metals of different components depending on the wavelength of the laser light used in the laser marking process.

The damage barrier layer 500 may further include a support layer 501. The support layer 501 may be a member that supports the reflective layer 503. A metal layer may be deposited as the reflective layer 503 on a first surface 501T of the support layer 501. The metal layer may be laminated in a form of a film as the reflective layer 503 on the first surface 501T of the support layer 501. The support layer 501 may include a resin or a polymer. The support layer 501 may constitute a body or a core of the damage barrier layer 500. The damage barrier layer 500 may further include an adhesive layer 502. The adhesive layer 502 may be formed on a second surface 501B of the support layer 501. The adhesive layer 502 may be formed by coating an adhesive to the second surface 501B of the support layer 501. The adhesive layer 502 may be a member that bonds the damage barrier layer 500 or the support layer 501 to the upper surface 210S of the second semiconductor die 210.

Figure 5:
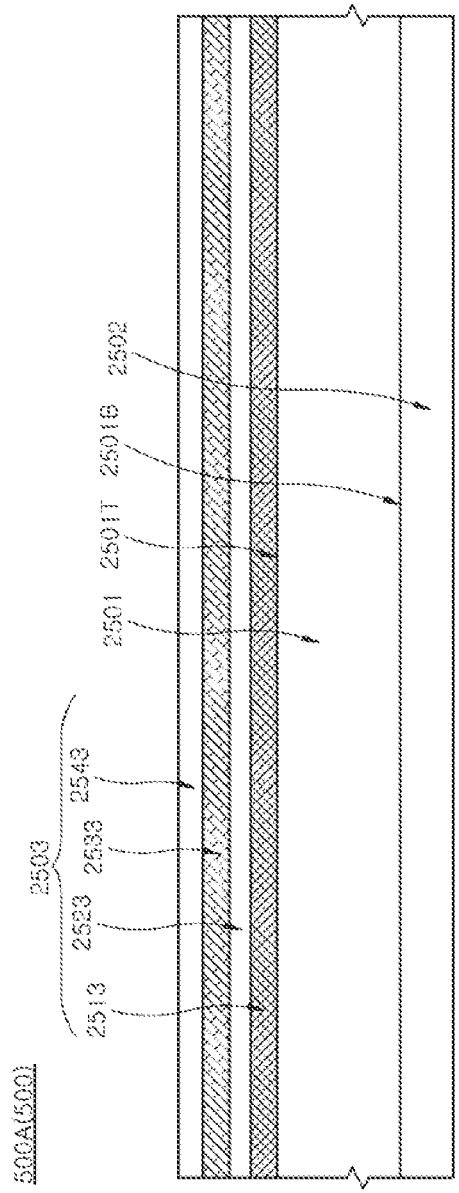
FIG. 5 is a schematic cross-sectional view illustrating another example of a damage barrier layer of the semiconductor package of FIG. 3.

FIG. 5 is a schematic cross-sectional view illustrating another example of the damage barrier layer 500 of the semiconductor package 10 of FIG. 3.

Referring to FIGS. 5 and 3, a damage barrier layer 500A according to another example may include a plurality of sub-metal layers 2513 and 2533. The plurality of sub-metal layers 2513 and 2533 may constitute a reflective layer 2503. The first sub-metal layer 2513 may be formed on a first surface 2501T of the support layer 2501. The second sub-metal layer 2533 may be deposited or laminated on the first sub-metal layer 2513. The first sub-metal layer 2513 or the second sub-metal layer 2533 may include copper, brass, bronze, aluminum, gold, or silver. The first sub-metal layer 2513 and the second sub-metal layer 2533 may be formed of layers of different metals. The plurality of sub-metal layers 2513 and 2533 may improve the efficiency of reflecting the incident laser light.

An intermediate layer 2523 may be formed between the first sub-metal layer 2513 and the second sub-metal layer 2533. The intermediate layer 2523 may include an adhesive layer for bonding the second sub-metal layer 2533 to the first sub-metal layer 2513. The intermediate layer 2523 may include a layer of a dielectric material or may include a resin layer or a polymer layer. The intermediate layer 2523 may be formed as a third sub-metal layer. The third sub-metal layer may include a metal layer different from that of the first sub-metal layer 2513 or the second sub-metal layer 2533.

A coating layer 2543 may be formed on the second sub-metal layer 2533. The coating layer 2543 may include an anti-reflective material such as silicon oxynitride (SiON) or a dielectric material. The coating layer 2543 may be a member that reduces diffuse reflection of the light reflected by the reflective layer 2503. The diffuse reflection of the laser light may cause undesired damage to the encapsulant layer (600 in FIG. 3) or the mark (700 in FIG. 3). The coating layer 2543 may reduce damage that may be caused by the diffuse reflection of laser light.

Figure 6:
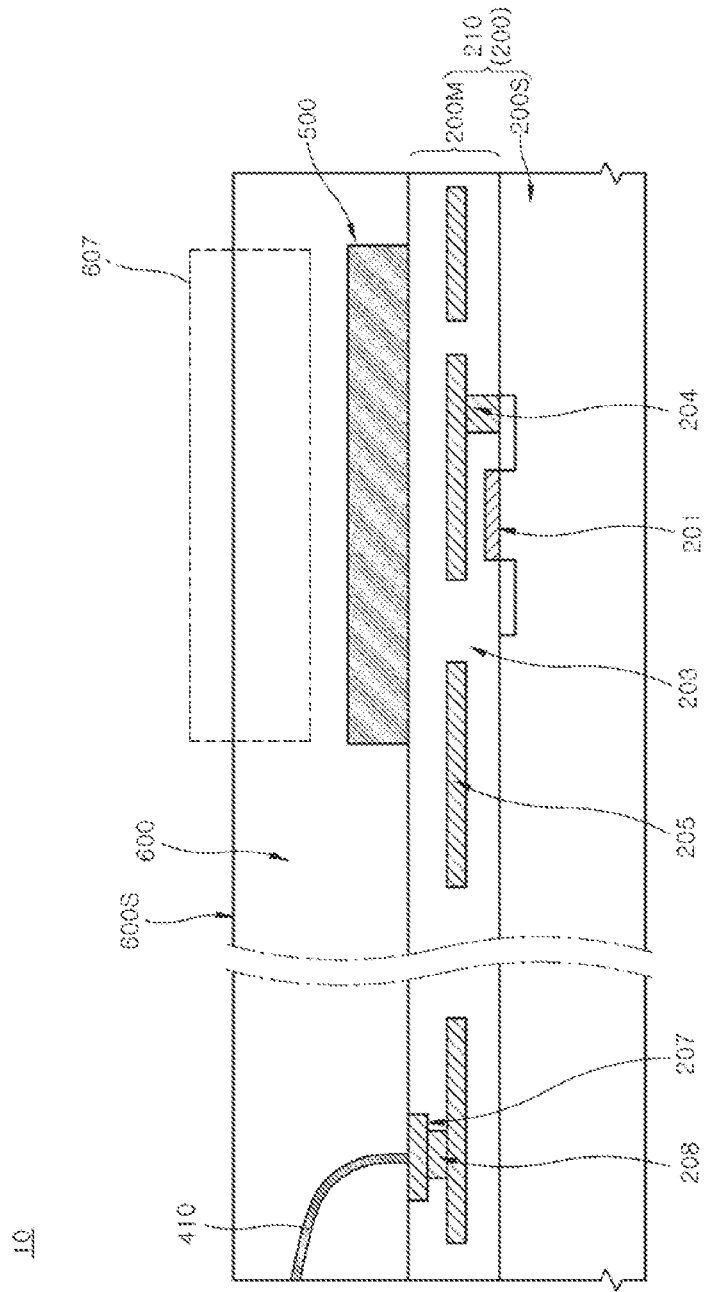
FIGS. 6 to 8 are schematic cross-sectional views illustrating process steps for forming a mark on the semiconductor package of FIG. 1.
Figure 7:
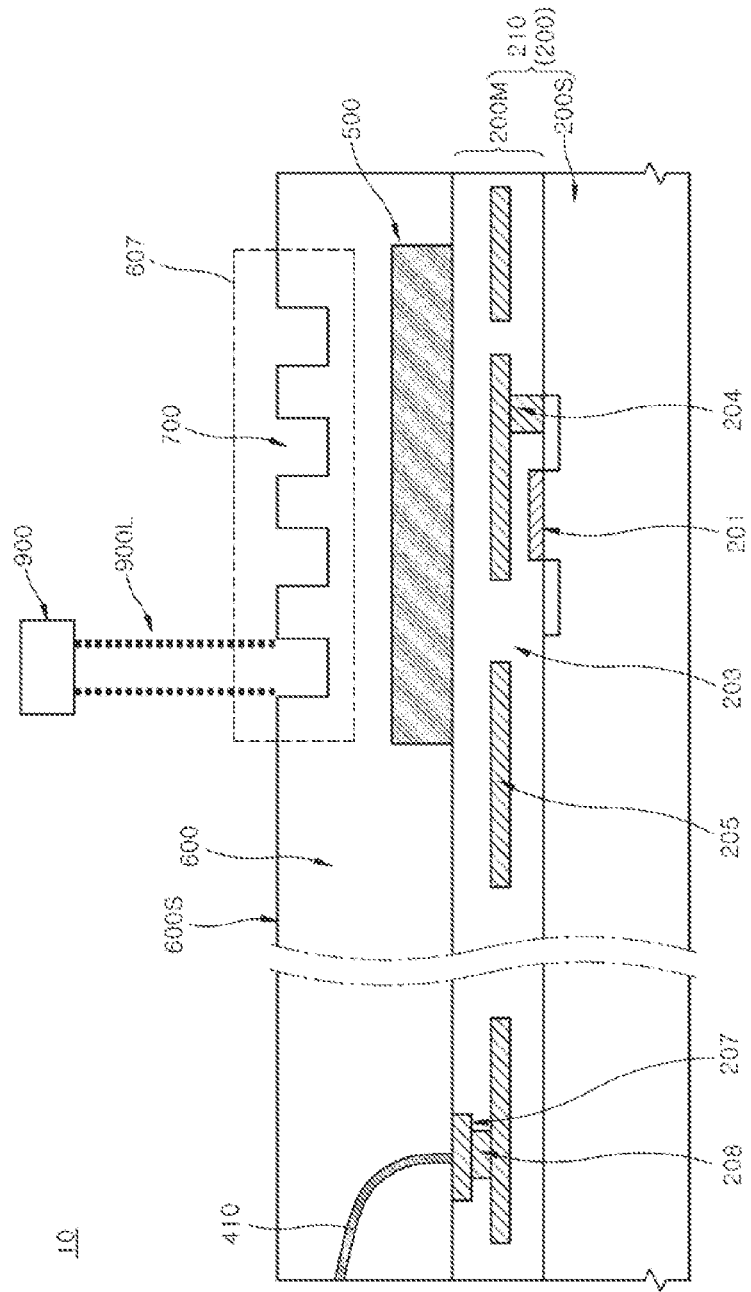
Figure 8:
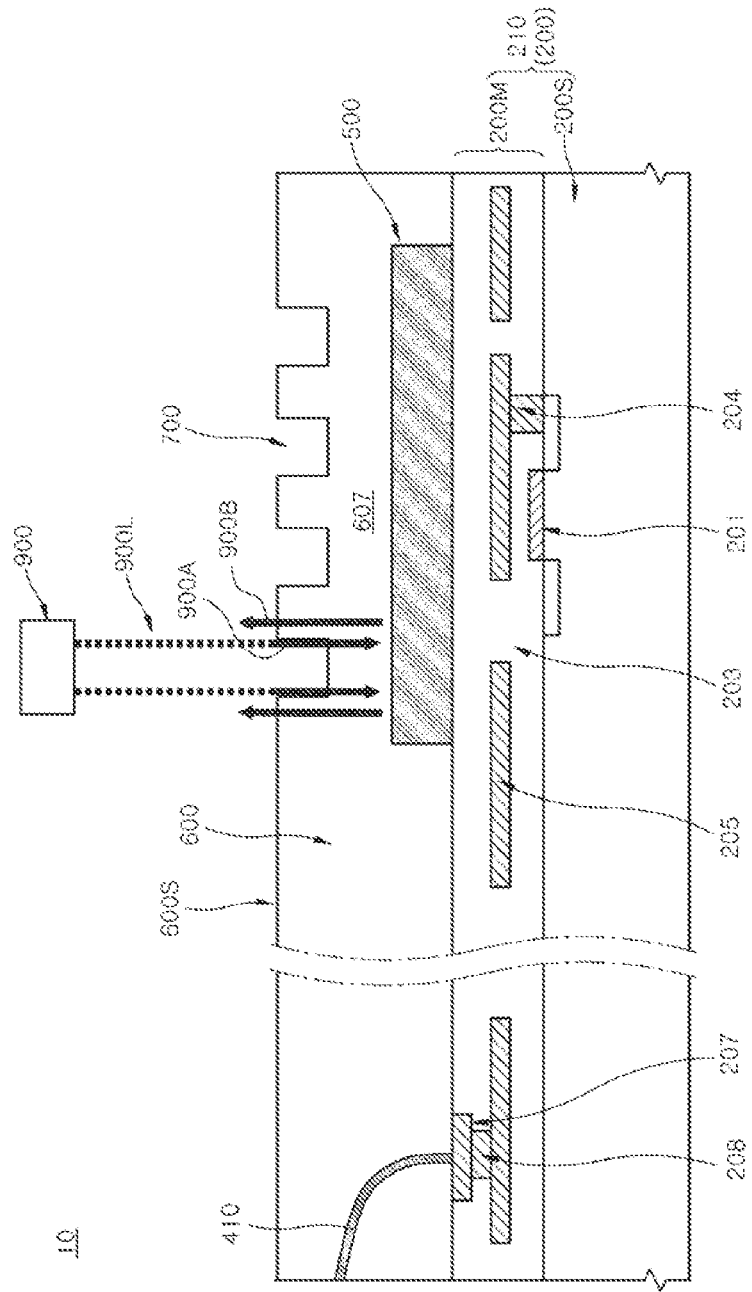

FIGS. 6 to 8 are schematic cross-sectional views illustrating process steps of forming the mark 700 on the semiconductor package 10 of FIG. 1.

Referring to FIG. 6, the encapsulant layer 600 of the semiconductor package 10 may be molded. After forming the encapsulant layer 600, a laser marking process may be performed on the marking region 607 of the encapsulant layer 600. Referring to FIG. 7, a laser irradiator 900 for laser marking may be introduced over the upper surface 600S of the encapsulant layer 600. The laser irradiator 900 may irradiate laser light 900L onto the marking region 607 of the encapsulant layer 600 to make the mark. A portion of the upper surface 600S of the encapsulant layer 600 may be engraved by the irradiated laser light 900L. Accordingly, the mark 700 may be formed on the upper surface 600S of the encapsulant layer 600. As the laser light 900L is irradiated to the encapsulant layer 600, an opening shape or a groove shape may be engraved in the marking region 607 of the encapsulant layer 600.

Referring to FIG. 8, a portion 900A of the laser light 900L may propagate undesirably deeper into the encapsulant layer 600. The portion 900A of the laser light 900L may pass through deeper below a bottom of the opening shape constituting the mark 700. If there is no damage barrier layer 500, the portion 900A of the laser light 900L may pass through the encapsulant layer 600 to reach the underlying second semiconductor die 210. The damage barrier layer 500 may serve to block the transmitted portion 900A of the laser light 900L. The damage barrier layer 500 may reflect the transmitted portion 900A of the laser light 900L. The reflected light 900B by the damage barrier layer 500 may be scattered into the encapsulant layer 600 or may be scattered outside the semiconductor package 10.

Figure 9:
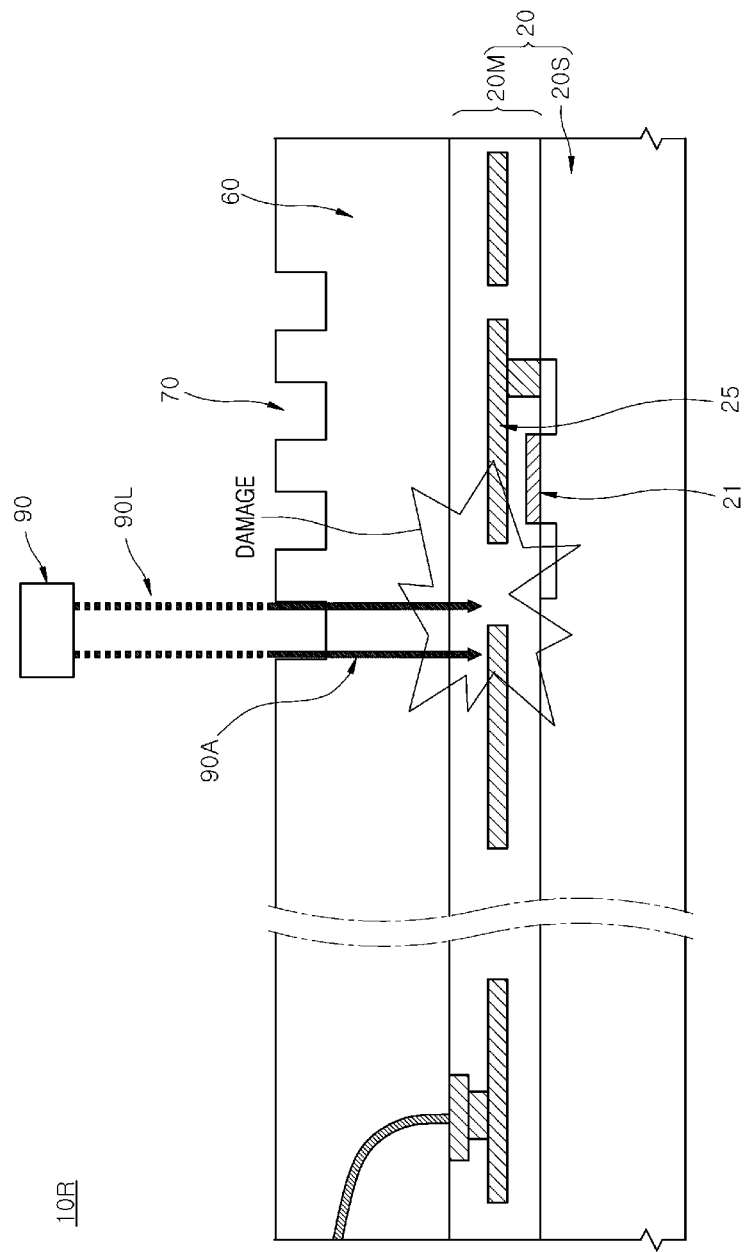
FIG. 9 is a schematic cross-sectional view illustrating a process step of forming a mark on a semiconductor package according to a comparative example.

FIG. 9 is a schematic cross-sectional view illustrating a process step of forming a mark 70 on a semiconductor package 10R according to a comparative example.

Referring to FIG. 9, the semiconductor package 10R according to the comparative example may include a semiconductor die 20 and an encapsulant layer 60. A laser marking process of introducing a laser irradiator 90 over the encapsulant layer 60 and irradiating laser light 90L onto the encapsulant layer 60 may be performed. The mark 70 may be formed on the encapsulant layer 60 by irradiation of the laser light 90L. While the laser light 90L is irradiated to the encapsulant layer 60, a portion 90A of the laser light 90L may undesirably propagate or transmit into the encapsulant layer 60.

The transmitted portion 90A of the laser light 90L may pass through the encapsulant layer 60 and reach the semiconductor die 20. The portion 90A of the laser light 90L may be incident on the semiconductor die 20 and damage the semiconductor die 20. The portion 90A of the laser light 90L may be incident on a metallization structure layer 20M of the semiconductor die 20 and damage the metallization structure layer 20M. The portion 90A of the laser light 90L may damage conductive patterns 25 constituting the metallization structure layer 20M. The transmitted portion 90A of the laser light 90L may be irradiated to an electronic element 21 configured on the semiconductor substrate 20S of the semiconductor die 20, whereby the electronic element 21 may be damaged. Such damage may cause a malfunction of the semiconductor die 20 and damage the reliability of the semiconductor package 10R.

Referring back to FIG. 8, the damage barrier layer 500 may block the transmitted portion 900A of the laser light 900L, thereby preventing damage to the second semiconductor die 210 by the laser light 900L. Because the semiconductor package 10 is configured to include the damage barrier layer 500, it is possible to effectively prevent damage to the semiconductor package 10 during the laser marking process. As such, the damage barrier layer 500 may contribute to improving the reliability of the semiconductor package 10. The damage barrier layer 500 may contribute to improving the quality of the semiconductor package 10 and improving the product yield of the semiconductor package 10.

Figure 10:
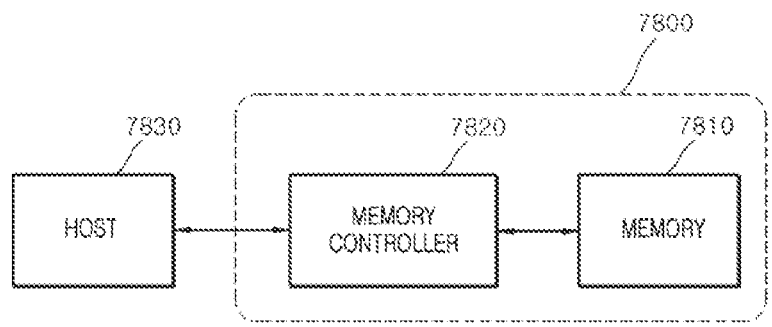
FIG. 10 is a block diagram illustrating an electronic system employing a memory card including a package in accordance with an embodiment of the present disclosure.

FIG. 10 is a block diagram illustrating an electronic system including a memory card 7800 employing at least one of the semiconductor packages according to embodiments of the present disclosure. The memory card 7800 may include a memory device 7810 such as a nonvolatile memory device, and a memory controller 7820. The memory device 7810 and the memory controller 7820 may store data or read out the stored data. At least one of the memory device 7810 and the memory controller 7820 may include at least one of the semiconductor packages according to the embodiments.

The memory device 7810 may be a nonvolatile memory device to which the technology of the embodiments of the present disclosure is applied. The memory controller 7820 may control the memory 7810 such that stored data is read out or data is stored in response to a read/write request from a host 7830.

Figure 11:
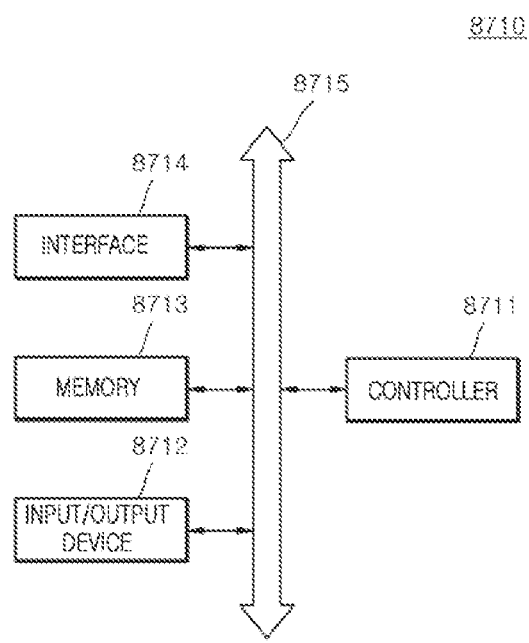
FIG. 11 is a block diagram illustrating an electronic system including a package according to an embodiment of the present disclosure.

FIG. 11 is a block diagram illustrating an electronic system 8710 including at least one of the semiconductor packages according to embodiments of the present disclosure. The electronic system 8710 may include a controller 8711, an input/output device 8712, and a memory device 8713. The controller 8711, the input/output device 8712, and the memory device 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 and/or the memory device 8713 may include at least one of the semiconductor packages according to the embodiments of the present disclosure. The input/output device 8712 may include at least one selected among a keypad, a keyboard, a display device, a touchscreen, and so forth. The memory device 8713 is a device for storing data. The memory device 8713 may store data and/or commands to be executed by the controller 8711, and the like.

The memory device 8713 may be a volatile memory device including DRAM and/or a nonvolatile memory device including flash memory. For example, a flash memory device may be mounted to an information processing system such as a mobile terminal or a desktop computer. The flash memory device may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 is equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet)

The present teachings have been disclosed in conjunction with some embodiments as described above. Those skilled in the art will appreciate that various modifications, additions, and substitutions are possible, without departing from the scope and spirit of the present disclosure. Accordingly, the embodiments disclosed in the present specification should be considered from not a restrictive standpoint but an illustrative standpoint. The scope of the present teachings is not limited to the above descriptions but defined by the accompanying claims, and all of the distinctive features in the equivalent scope should be construed as being included in the present teachings.

What is claimed is:

1. A semiconductor package comprising:
   a semiconductor die;
   an encapsulant layer covering the semiconductor die;
   a mark formed on a surface of the encapsulant layer; and
   a damage barrier layer disposed between the mark and the semiconductor die,
   wherein the damage barrier layer includes a reflective layer that reflects laser light.

2. The semiconductor package of claim 1, wherein the mark is engraved on the surface of the encapsulant layer.

3. The semiconductor package of claim 1, wherein the damage barrier layer is disposed under marking region of the encapsulant layer in which the mark is formed.

4. The semiconductor package of claim 1, wherein the damage barrier layer is attached to the semiconductor die to cover a portion of the semiconductor die overlapped by the mark.

5. The semiconductor package of claim 1, wherein the damage barrier layer further includes:
   a support layer supporting the reflective layer; and
   an adhesive layer formed on the support layer.

6. The semiconductor package of claim 1, wherein the reflective layer includes a metal layer.

7. The semiconductor package of claim 6, wherein the metal layer includes at least one of copper, brass, bronze, aluminum, gold, and silver.

8. The semiconductor package of claim 1, wherein the reflective layer includes a plurality of sub-metal layers.

9. The semiconductor package of claim 1, wherein the reflective layer reflects at least one of green laser light and YAG laser light.

10. The semiconductor package of claim 1, wherein the semiconductor die includes:
    a semiconductor substrate;
    an electronic component formed on the semiconductor substrate;
    conductive patterns formed on the semiconductor substrate; and
    a dielectric layer insulating the conductive patterns, wherein the damage barrier layer is attached to a surface of the dielectric layer.

11. A semiconductor package comprising:
    a packaging substrate;
    a plurality of semiconductor dies stacked on the packaging substrate;
    a damage barrier layer attached to an upper surface of an uppermost semiconductor die of the plurality of semiconductor dies;
    an encapsulant layer covering the plurality of semiconductor dies and the damage barrier layer; and
    a mark formed on a portion of the encapsulant layer overlapping the damage barrier layer,
    wherein the damage barrier layer includes a reflective layer that reflects laser light.

12. The semiconductor package of claim 11,
    wherein the uppermost semiconductor die includes:
    a semiconductor substrate;
    a dielectric layer formed on the semiconductor substrate; and
    a bonding pad exposed by the dielectric layer, wherein a bonding wire is connected to the bonding pad.

13. The semiconductor package of claim 12, wherein the damage barrier layer is attached to an upper surface of the dielectric layer while being spaced apart from the bonding wire.

14. The semiconductor package of claim 12, wherein the bonding wire connects the uppermost semiconductor die to at least one remaining semiconductor die of the plurality of semiconductor dies and further extends to be connected to the packaging substrate.

15. The semiconductor package of claim 11, wherein the damage barrier layer further includes:
    a support layer supporting the reflective layer; and
    an adhesive layer formed on the support layer.

16. The semiconductor package of claim 11, wherein the reflective layer includes a metal layer.

17. The semiconductor package of claim 16, wherein the metal layer includes at least one of copper, brass, bronze, aluminum, gold, and silver.

18. The semiconductor package of claim 11, wherein the reflective layer includes a plurality of sub-metal layers.

* * * * *